United States Patent [19]

Genuit et al.

[11] 4,156,189

[45] May 22, 1979

[54] POWER SUPPLY FAULT ANALYZER

[75] Inventors: Luther L. Genuit, Scottsdale; John R. Nowell, Phoenix, both of Ariz.

[73] Assignee: Honeywell Information Systems Inc., Phoenix, Ariz.

[21] Appl. No.: 832,714

[22] Filed: Sep. 12, 1977

[51] Int. Cl.² .................. G01R 31/22; G08B 21/00
[52] U.S. Cl. .................. 324/158 D; 340/645
[58] Field of Search .......... 324/158 D, 158 T, 102, 324/158 R, 133; 340/253 E, 645

[56] References Cited

U.S. PATENT DOCUMENTS

| | | | |
|---|---|---|---|
| 3,200,392 | 10/1965 | Chumakov | 324/158 D |
| 3,975,683 | 8/1976 | Behrens et al. | 324/158 D |

Primary Examiner—Rudolph V. Rolinec
Assistant Examiner—Ernest F. Karlsen
Attorney, Agent, or Firm—William W. Holloway, Jr.; Ronald T. Reiling

[57] ABSTRACT

An apparatus for detecting each short circuited diode in a plurality of diodes, coupled in a parallel combination, is disclosed. The apparatus utilizes a flashing light emitting diode to indicate whether the particular diode under test is shorted or not. By utilizing the series inductance associated with each diode circuit, effective isolation of the particular diode under test is obtained for a short duration test pulse and allows the appropriate test to be made.

3 Claims, 4 Drawing Figures

POWER SUPPLY FAULT ANALYZER

CROSS REFERENCES TO RELATED APPLICATIONS

1. High Current Switching Regulator With Overlapping Current Output Pulses by Luther L. Genuit and John R. Nowell, bearing U.S. Pat. No. 3,573,597 issued Apr. 6, 1971 and assigned to the same assignee as the instant invention.

2. Switching Regulator Control Circuit invented by John R. Nowell, bearing Ser. No. 676, 175, filed Apr. 12, 1976 and assigned to the same assignee as the instant invention.

PRIOR ART

In order to determine whether or not a diode has been shorted in a circuit utilizing a plurality of diodes in parallel and without any series resistance in each diode circuit, it has been necessary to unsolder one of the diode leads in order that an ohmmeter could be utilized to determine whether or not the diode had been shorted. In the case where there was a large number of such diodes in parallel it was often necessary to detach each of the diodes individually until the faulty diode was detected which, in the worst case, could require, for electrical isolation the removal of one lead on all the diodes. In the specific application for which the instant invention has been designed, the use of that method of checking the output diodes is not only time consuming but also because of the positioning and size of the power diodes used, a high wattage soldering iron is required to remove the leads. Constant soldering and unsoldering of the output diodes often results in their destruction due to the degrading effects of their performance caused by the repetitive application of intensive heat. The use of the ohmmeter is not possible without taking the diode out of the circuit because of the lack of series impedance in each of the parallel branches of the multiplicity of output diodes.

1. Field of Invention

This invention relates generally to electronic circuitry used to diagnose failures in power supply output circuits. More specifically, the power supply fault analyzer provides a means for determining whether or not an output diode in a parallel combination of output diodes has been shorted without having to remove the leads from any of those diodes.

2. Background of the Invention

The prior art device used to test the output diodes of a power supply circuit was an ohmmeter which when properly connected, would indicate a very low forward impedance when the diode forward biased by the power supply in the ohmmeter and a very high impedance when the diode was reversed biased, assuming that the diode was operating properly. When the ohmmeter met a very low impedance, regardless of the polarity of the ohmmeter leads, it indicated that the diode had been shorted and therefore required replacement. However, in high current output power supplies, individual output diodes may be required to be connected in parallel in order that the necessary amperage can be delivered by the power supply. In this instance if one output diode were shorted the same reading would be made by the ohmmeter regardless of which diode the input leads to the ohmmeter were connected to. In order to overcome this problem, it was necessary to disconnect the leads of the output diodes one at a time to remove that diode from the parallel combination of the output diodes. Removing at least one of the leads of each diode was required until the individual diode that had become shorted was discovered. All this required a great deal of time and disassembly of the power supply as well as soldering and unsoldering of the output diode terminals. Because, in a large amperage system the output diodes are very large, it is necessary to use a very high wattage soldering iron to remove the output lead wires, which can cause degradation or destruction of the diode itself.

SUMMARY OF THE INVENTION

The power supply fault analyzer of the instant invention is designed to be utilized to isolate and identify shorted diodes in a high output current power supply. A short duration output pulse is applied across the suspected faulty diode and the circuit response to that pulse is compared with the response of a circuit which contains no faulty diodes. If a fault condition exists, a pulsating output signal is applied to an indicating circuit containing a red, light emitting diode. Illumination of the red light emitting diode indicates to the engineer that the diode is faulty. If the pulse is applied across a functional diode, a separate pulsating output signal is generated which, in the instant invention is connected to an indicating circuit consisting of a green light emitting diode illumination of green light emitting diode informs the engineer that the diode under test has not been shorted. The power supply fault analyzer contains very few parts and is therefore adaptable to packaging in a small, compact, easy to carry package which may be operated with either battery or line voltage.

It is therefore an object of this invention to provide an apparatus to test for and detect shorted diodes in the output circuit of a power supply.

It is a further object of this invention to provide an apparatus which detects short circuited diodes in the output circuit of a power supply by utilizing the inductance of a series output winding of the power supply.

It is a still further object of this invention to provide visual indication means which will indicate whether the diode under test is or is not short circuted.

DETAILED DESCRIPTION OF THE PREFERRED EMBODIMENT

Figure 1:
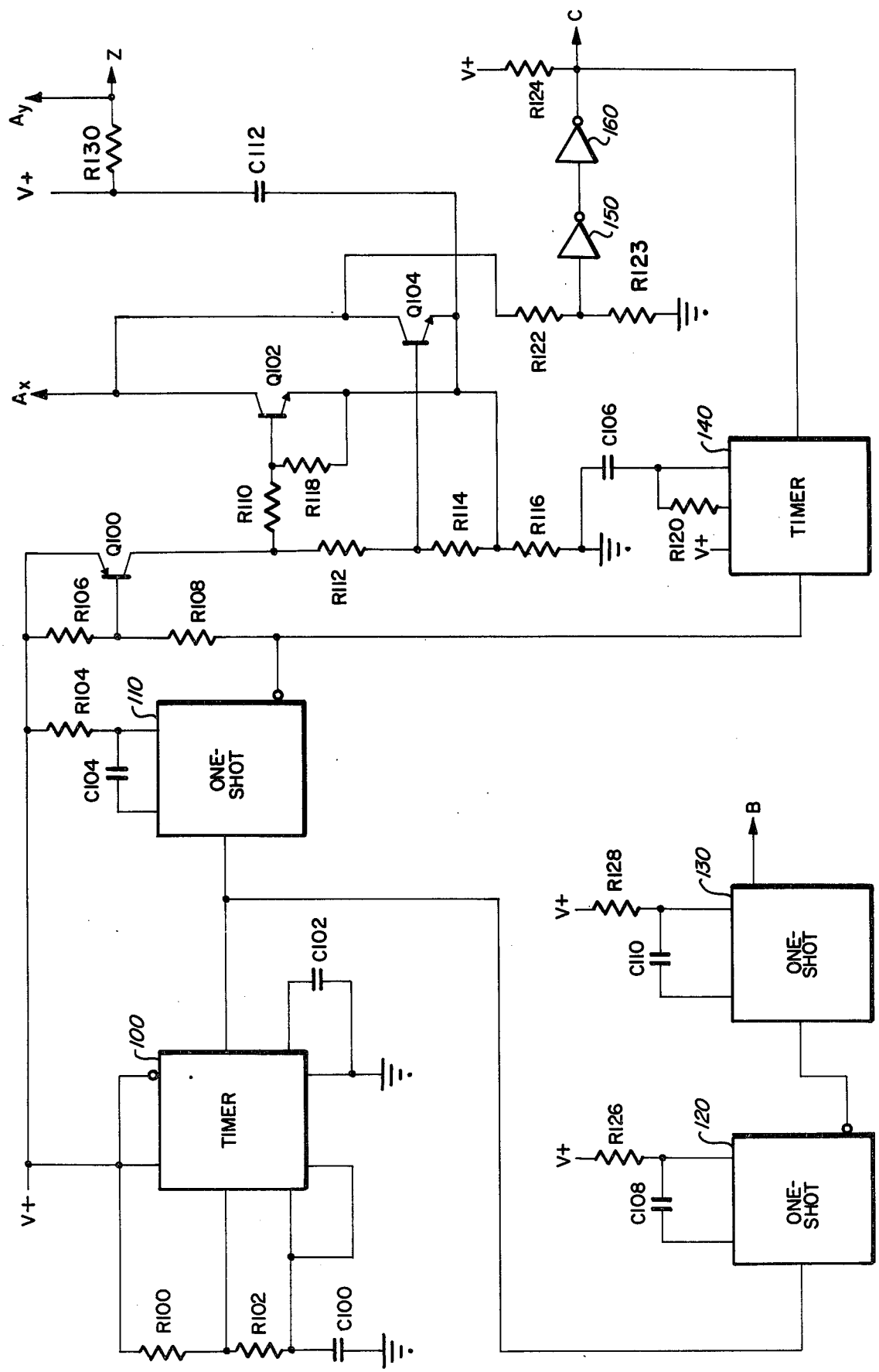
FIGS. 1 and 2 are the schematic diagrams for the power supply fault analyzer.
Figure 2:
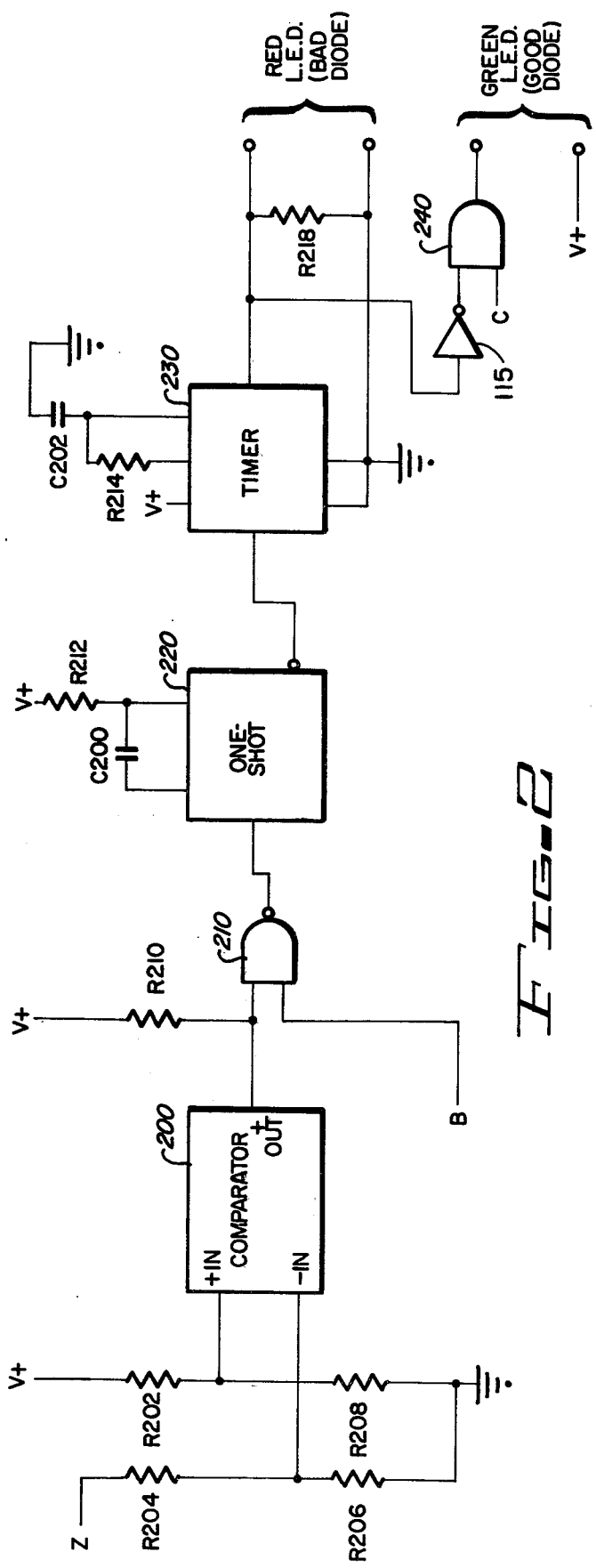

The power supply fault analyzer, the schematic of which is depicted in the preferred embodiment illustrated in FIGS. 1 and 2, operates with standard TTL logic circuitry and a power supply voltage +5 volts DC.

In the preferred embodiment, timer 100 is a free running clock with a one second period and a 50 percent duty cycle. This timing is obtained by having resistor R100 a 100,000 ohm resistor, R102 a 1.5 megohm resistor, and C100 a one microfarad capacitor. A Signetics model 555 timer is utilized in the instant invention, however, it would be obvious to one skilled in the art to use any one of a variety of other type clock devices instead of the one shown. In that case the resistance and capacitance values would be required to be changed according to the specification of the other devices used. A positive going edge of the output pulse from timer 100 triggers the monostable (one shot) multivibrator 110, whose negative going output provides a ground path from the power supply voltage through resistors R106 and R108 and triggers timer 140. With current flowing through resistors R106 and R108, transistor Q100 is forward biased and current flows through resistors R110, R118, R112, R114, and R116 forward biasing transistors Q102 and Q104 which have their collectors and emitters connected in parallel. When so energized output $A_x$ is connected to the negative terminal of capacitor C112 through transistors Q102 and Q104. With transistors Q102 and Q104 conducting, capacitor C112 is discharged through resistor R130 via output $A_y$. The resulting voltage waveform at $A_y$ is divided by resistor network R204 and R206 of FIG. 2 which acts as an input to voltage comparator 200. That voltage waveform is compared with a threshold level established by resistors R202 and R208 and acts as the other input to comparator 200. If the voltage at the junction of resistors R202 and R206 is less than the voltage at the junction of resistors R202 and R208 the output of comparator 200 goes to a positive logic value via pull up resistors R210.

At the same time that timer 100 is triggering one shot multivibrator 110 the output of the timer is also triggering one shot multivibrator 120 which produces a one microsecond negative going pulse, whose rising edge triggers one shot multivibrator 130 which in turn produces a second one microsecond pulse. The output signal of one shot multivibrator 130 is a positive pulse and an input to NAND gate 210. The output signal of NAND gate 210 will go from a normally high to a low state for the duration of the output signal of one shot multivibrator 130 only if there is a positive output from comparator 200. Such a positive output from comparator 200 would indicate, as will be explained infra, that a shorted diode has been found. At the time the output signal of one shot multivibrator 130 returns to its logical zero state, one shot multivibrator 220 is triggered in order to provide wave shaping for the signal that will trigger timer 230. The RC time constant for timer 230 is set for a one half second pulse output which triggers the red light emitting diode connected across resistor R218 and indicates that a shorted diode has been detected. The ouput signal of one shot multivibrator 110 is also used to trigger timer 140 which produces a pulse with a duration of somewhat less than one half second. The output pulse of timer 140 will enable NAND gate 240 to pass current through the green light emitting diode connected between the power supply and NAND gate 240 only if the timer 230 has not been triggered by one shot multivibrator 220. A second requirement for enabling NAND gate 240 is that the signal produced by the voltage divider comprised of R122 and R123 must be above the threshold value of the output signal of inverter 115 in order for the open collector output of timer 140 or the second inverter 160 to go to a logical "1" level and enable NAND gate 240. This can only occur if test probes connected at $A_x$ and $A_y$ are making contact in the test circuit, thereby introducing a positive voltage at the collector of transistors Q102 and Q104.

Figure 3:
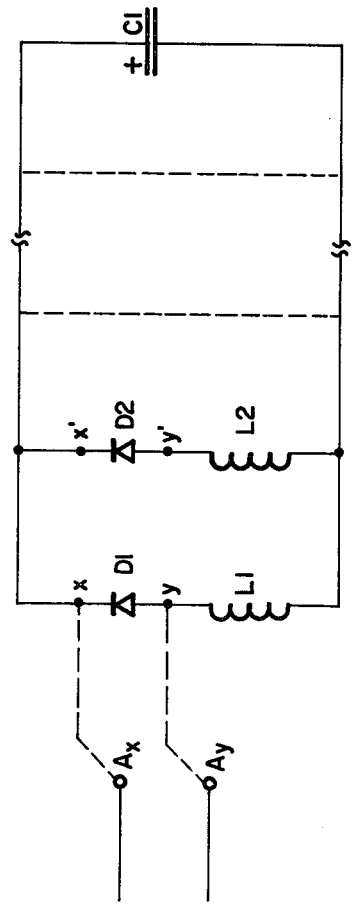
FIG. 3 illustrates the manner in which the power supply fault analyzer would be connected to the output diodes during test.

FIG. 3 depicts, in simplified form, how the power supply fault analyzer is connected to the power supply under test. In some cases there may be more than 32 output diodes. It is also to be noted that the output filter C1 of FIG. 3 is necessary for proper operation of the power supply fault analyzer.

Figure 4:
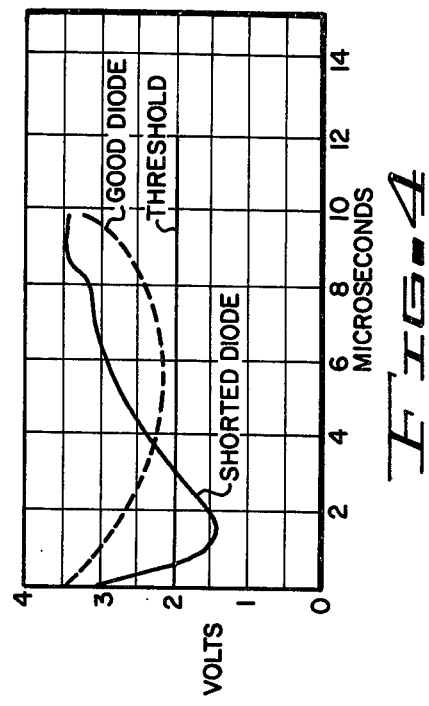
FIG. 4 is a graph of the response at point $A_y$ of FIG. 1, when a shorted diode is being tested and also when an operable diode is being tested.

FIG. 4 is a graph of the response of the power supply circuit when capacitor C112 is discharged across diode D1 and when transistors Q102 and Q104 of FIG. 1 are forward biased. It is to be noted that in the event a shorted diode is under test a very rapid discharge of capacitor 112 occurs and at approximately one microsecond after the switching occurs, the voltage at $A_y$ of FIG. 1 is less than the threshold voltage used as the positive input to comparator 200. Also shown in FIG. 4 is the response to the power supply circuit when all of the output diodes are operating properly.

It can therefore be seen that when using timer 100 as a free running clock whenever power is supplied, capacitor C112 will be discharged across the diode under test once each time period of the pulse generated by the timer 100., Approximately one microsecond after the discharge of capacitor C112 has begun, the output signal of comparator 200 is enabled by the output of one shot multivibrator 130 so that if a shorted diode has been detected, one shot 220 will be triggered and timer 230 will pulse the red light emitting diode indicating to the test engineer that the diode under test is shorted. At the same time the output signal of one shot multivibrator 110 causes transistors Q102 and Q104 to conduct, timer 140 is triggered. If the diode under test is not in fact shorted, the output signal of inverter 160 will allow a logic "1" input signal to NAND gate 240 for the duration of the output pulse of timer 140 and cause the green light emitting diode to flash indicating to the test engineer that the diode under test is not shorted.

While the principles of the instant invention have now been made clear in an illustrative embodiment, there will be many modifications of the structure, arrangement, proportion, elements, material, and components that are obvious to those skilled in the art without departing from those principles. The appended claims are therefore intended to cover and embrace any such modifications within the limits of the true scope and spirit of the invention.

What is claimed is:

1. A power supply fault analyzer for testing each of a plurality of power supply output diodes, wherein said output diodes are coupled in parallel, comprising:

signal generating means for providing a signal pulse for application to a one of said plurality of power supply output diodes being tested;

timing means for providing a timing signal at a predetermining interval after generation of said signal pulse;

signal comparison means coupled to said signal generating means for comparing a response of said signal pulse coupled to said one power supply output diode with a reference signal of predetermined value;

first trigger means coupled to said timing means and to said signal comparison means for activating a fault indication signal when said signal pulse coupled to said one diode is lesser than said reference signal after said interval determined by said timing signal; and second trigger means coupled to said signal generating means for providing a no-fault indicator signal in an absence of a fault indicator signal.

2. The power supply fault analyzer as recited in claim 1, wherein said signal generating means includes a capacitor, wherein discharging said capacitor through said one diode provides said signal pulse.

3. The power supply fault analyzer as recited in claim 2, wherein said timing means provides said timing signal one microsecond after said signal pulse has been applied across said one power supply output diode.

* * * * *